United States Patent [19]

Zimmerman et al.

[11] Patent Number: 4,966,142

[45] Date of Patent: Oct. 30, 1990

[54] METHOD FOR ELECTRICALLY JOINING SUPERCONDUCTORS TO THEMSELVES, TO NORMAL CONDUCTORS, AND TO SEMI-CONDUCTORS

[75] Inventors: George O. Zimmerman, South Hamilton; Alvaro Kaplan, Brookline, both of Mass.

[73] Assignee: Trustees of Boston University, Boston, Mass.

[21] Appl. No.: 374,411

[22] Filed: Jun. 30, 1989

[51] Int. Cl.$^5$ .............................................. B23K 1/02
[52] U.S. Cl. .............................. 228/263.12; 228/179
[58] Field of Search ............... 420/526, 527, 577, 555, 420/580, 901; 228/263.11, 263.12, 263.18, 179; 428/901

[56] References Cited

U.S. PATENT DOCUMENTS

| | | | |
|---|---|---|---|
| 1,959,668 | 5/1934 | Gray | 420/526 |
| 3,165,403 | 1/1965 | Treaftis | 420/526 |
| 3,323,912 | 6/1967 | Bolda et al. | 420/555 |
| 3,374,093 | 3/1968 | King | 420/580 |

OTHER PUBLICATIONS

Tyzack et al. "An X-Ray Examination of the Indium Rich Alloys of the Systems In+Pb and In−Hg" (1954) pp. 675–681.

Denny et al., *Transactions AIME; Journal of Metals*, Jan. 1952, pp. 39–42.

Ludwick *Indium-Discovery, Occurrence, Development*, The Indium Corp of America, Utica, N.Y. (1950), pp. 193–194, 198–206.

*Primary Examiner*—Kenneth J. Ramsey
*Attorney, Agent, or Firm*—David Prashker

[57] ABSTRACT

A unique class of bonding alloys and methods for their use are provided which enable the user to electrically join superconductive materials to themselves, to normal conductive materials, or to semi-conductors. The bonding alloys have enhanced wetting properties and a melting point less than 100° C. in all instances. The bonding alloys are unusual and advantageous in that they create an intimate, direct, mechanical and electrical contact between the superconductive material and any other electrical conductor while minimizing mechanical and chemical stresses and avoiding alterations to the superconductive material itself.

6 Claims, 5 Drawing Sheets

METHOD FOR ELECTRICALLY JOINING SUPERCONDUCTORS TO THEMSELVES, TO NORMAL CONDUCTORS, AND TO SEMI-CONDUCTORS

FIELD OF THE INVENTION

The present invention is concerned with electrically conductive alloys useful as solders to join electrically conductive metals and/or ceramics together; and is particularly directed to metallic alloys which provide little electrical interface resistance when employed to electrically join superconductors to themselves, to normal conductors, or to semiconductors.

BACKGROUND OF THE INVENTION

Superconductivity was first observed by the Dutch physicist H. K. Onnes in 1911 during his investigations of the electrical conductivities of metals at very low temperatures. He observed that as purified mercury is cooled, its electrical resistivity vanishes abruptly at a temperature of 4.16° K. Above this temperature, the electrical resistivity is small but finite and measurable; alternatively, when the temperature is reduced below 4.16° K., the electrical resistivity is so small that it is effectively zero. This distinct temperature at which the transition and loss of effective electrical resistivity occurs has been termed the critical temperature or "$T_c$". Onnes believed he had discovered a new state of physical matter at temperatures below the critical temperature and coined the term "superconducting state" for the observed phenomenon at temperatures below the critical temperature ($T_c$) and the term "normal state" for the electrical properties observed at temperatures above the critical temperature. Onnes also found that the superconducting transition is reversible and that the superconducting material recovered its normal, electrical resistivity at the critical temperature.

The modern theory of superconductivity is the result of the research investigations by Bardeen, Cooper, and Schrieffer [*Phys. Rev.* 106:162 (1957)]. Their proposal, conventionally known as the "BCS theory", has now gained universal acceptance because it has proved capable of explaining most of the observed phenomena relating to superconductivity. Their principles employ a quantum mechanical treatment of the superconductive phenomenon; and their theory has been employed to explain the various observable effects such as zero electrical resistance, the Meissner effect, and the like. Since the BCS theory is so steeped in quantum mechanics, the reader is directed to published texts in the scientific literature for a complete description and explanation. These include: M. A. Omar, *Elementary Solid State Physics: Principles And Applications*, Addison-Wesley Publishing Company, 1975, pages 496–527; M. Tinkham, *Introduction To Superconductivity*, McGraw-Hill Co., 1975.

Superconductivity has been found not to be a rare phenomenon It is exhibited by a substantial number of atomic elements, metallic alloys, and most recently, refractory oxide ceramics. For many years, the highest known critical temperature was only 23° K. There has, accordingly, been intense interest and research investigations into finding superconductive materials with much higher critical temperatures, most desirably those which hopefully would approach room temperature (20° C.) Until very recently, efforts to achieve this goal have met with complete failure. Beginning about 1986, however, polycrystalline scintered ceramic pellets of yttrium-barium-copper oxide and mixtures of potassium, barium, bismuth, and oxygen without copper have been found to demonstrate relatively high critical temperatures ($T_c$) and superconductivity at temperatures up to 120° K. [Bednorz, J. G. and K. A. Muller, *Z. Phys.* B64:189 (1986); Wu et al., *Phys. Rev. Lett.* 58:905 (1987); and Chu et al., *Phys. Rev. Lett.* 60:941 (1988)]. These investigations and the development of everhigher $T_c$ superconductive materials continues to be an area of intense exploration.

A concomitant and continuing problem has also arisen regarding the electrical joining of superconductive materials, particularly high $T_c$ superconductors to themselves and to other electrically conductive materials in the normal state. By definition, electrically conductive materials in the normal state include both the normal conductors such as gold, silver, copper, and iron; and the semi-conductors such as carbon, silicon, gray tin, and germanium as well as their mixtures with indium, gallium, antimony, and arsenic.

Traditionally, solders—a general term for alloys useful for joining metals together by the process of soldering—have been used to electrically join conductors to themselves and to semi-conductors. The principal types of solder conventionally known are: soft solders such as lead-tin alloys; and brazing solders such as alloys of copper and zinc and sometimes silver. Representative of conventionally known solders and soldering techniques are U.S. Pat. No. 3,600,144 describing a low melting point brazing alloy; U.S. Pat. No. 4,050,956 describing a method of chemically bonding metals to refractory oxide ceramics; U.S. Pat. No. 4,580,714 disclosing a hard solder alloy comprising copper, titanium, aluminum, and vanadium; U.S. Pat. No. 4,582,240 revealing a method for intermetallic diffusion bonding of piezo-electric components; U.S. Pat. No. 4,621,761 identifying a brazing process for forming strong joints between metals and ceramics while limiting the brazing temperature to not more than 750° C.; and U.S. Pat. No 4,631,099 describing a method for adhesion of oxide type ceramics and copper or a copper alloy. More recent attempts to refine techniques for lowering the resistance of electrical contacts between superconductive materials include annealing bulk sintered samples of yttrium-barium-copper oxide at temperatures up to 500° C. for an hour [*Superconductor News*, May—June, 1988, page 5]; and the use of laser energy to deposit a thin film of superconductive yttrium-barium-copper oxide directly onto a silicon substrate [*Superconductor News*, May—June, 1988, page 1]. All of these methods require either extreme temperatures or sophisticated equipment. It is, thus, unequivocally clear, therefore, that there remains a long recognized and continuing need for new compositions able to serve as solders and which demonstrate little or no electrical resistance at superconductive temperatures and yet are able to maintain strength and adhesion between superconductors or superconductive materials with conductors and semiconductors.

SUMMARY OF THE INVENTION

The present invention provides alloys useful for electrically joining superconductive materials to themselves, to conductive materials, or to semi-conductive materials, these alloys comprising:

from about 10 to 90 atomic percent indium; and an additive comprised of from 0 to about 40 atomic percent mercury, from 0 to about 40 atomic percent gallium, from 0 to about 55 atomic percent bismuth, from 0 to about 30 atomic percent cadmium, from 0 to about 15 atomic percent tin, and from 0 to about 10 atomic percent lead, these alloys in being able to substantially wet the materials to be electrically joined and providing a joined electrical interface resistance of not more than about $10^{-3}$ ohms per square centimeter at temperatures not more than about 20° C.

The present invention also provides a method for electrically joining superconductive materials to themselves, to conductive materials, or to semi-conductive materials, said method comprising the steps of:

obtaining a superconductive alloy comprised of from about 10 to 90 atomic percent indium, and an additive comprised of from 0 to about 40 atomic percent mercury, from 0 to about 40 atomic percent gallium, from 0 to about 55 atomic percent bismuth, from 0 to about 30 atomic percent cadmium, from 0 to about 15 atomic percent tin, and from 0 to about 10 atomic percent lead;

preparing a surface of each material to be joined as a clean surface;

heating said alloy such that at least a non-oxidized, semi-liquid state is formed;

introducing said heated alloy to each clean surface such that each of said surfaces becomes substantially wetted by said heated alloy;

applying additional heated alloy to each of said wetted surfaces concurrently to form a continuous alloy juncture between said materials; and allowing said alloy juncture to solidify such that a joined electrical interface resistance of not more than $10^{-3}$ ohms per square centimeter is provided by said solidified alloy at temperatures not greater than about 20° C.

DETAILED DESCRIPTION OF THE DRAWING

The present invention may be more easily and completely understood when taken in conjunction with the accompanying drawing, in which.

DETAILED DESCRIPTION OF THE PREFERRED EMBODIMENTS

Figure 1:
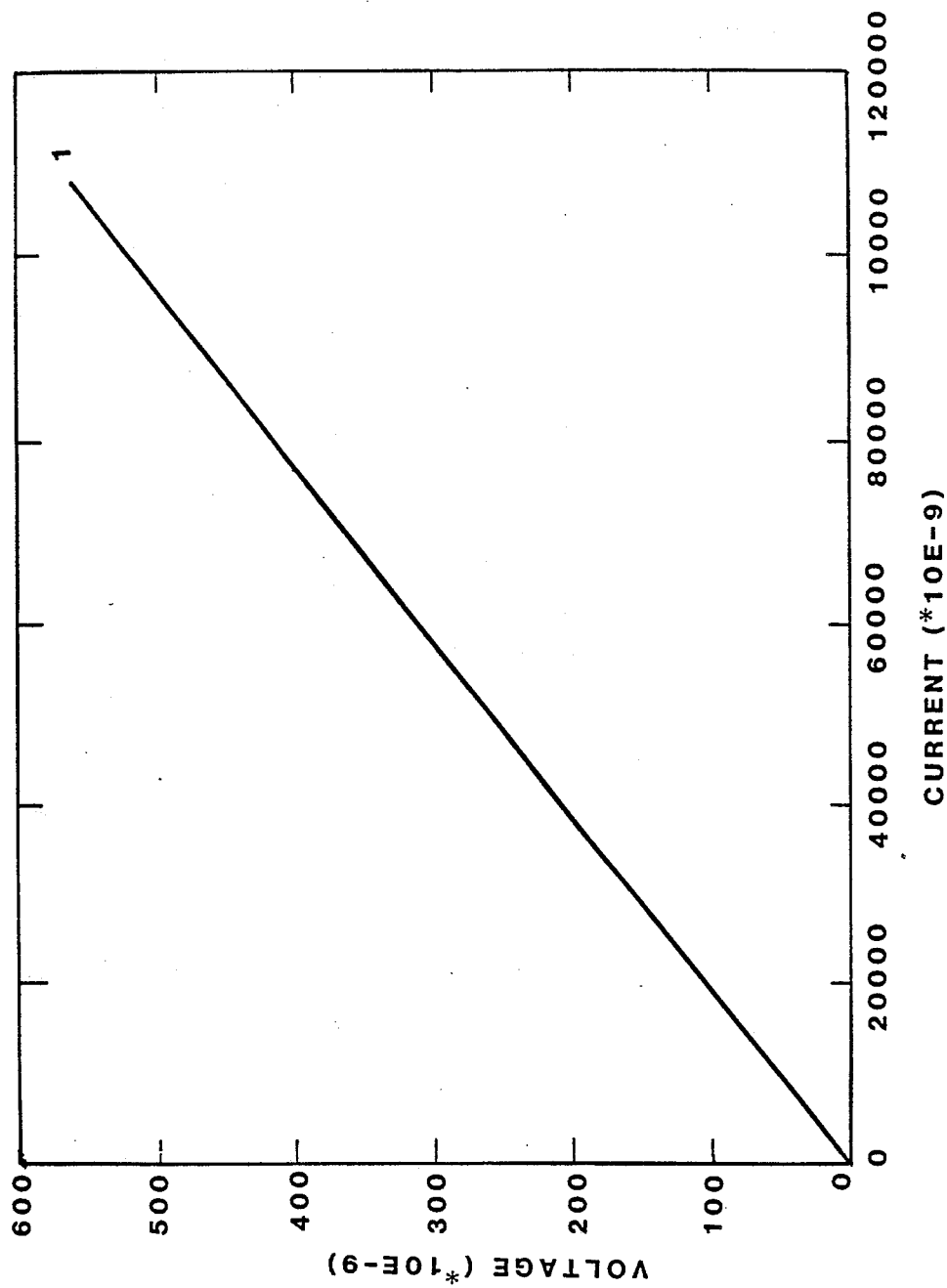
FIG. 1 is a graph illustrating the current-voltage characteristics of one preferred eutectic mixture of the present invention.

The present invention is a metallic alloy, conventionally termed a solder, which when melted into a liquid or semi-liquid state is useful for joining and providing electrical contact between superconductive materials, between superconductors and normal metallic conductors, and between superconductors and semi-conductive materials. Employed properly, these unique metallic alloys provide an adherent and intimate, direct contact between the superconductive material and the material to which it is electrically joined—while minimizing the mechanical and chemical stresses and alterations to the superconductive material itself. While a variety of different chemical compositions and formulations are encompassed by the metallic alloys comprising the present invention, each embodiment demonstrates at least four valuable physical properties which are shared in common. These are: improved wetting properties; a melting point which is less than 100° C.; an unusual degree of chemical stability which avoids oxidation at temperatures less than 100° C. and does not chemically attack other metals and/or ceramic oxides; and an electrical interface resistance at ambient room temperature (20° C.) which is not more than $10^{-3}$ ohms per square centimeter.

The metallic alloys comprising the present invention presume both familiarity and substantive knowledge regarding metals and metallurgy, modes of preparation, and conventional practices regarding electrically conductive metallic alloys commonly useful as solders in a variety of different applications. The detailed description which follows hereinafter employs the common and conventionally used definitions and usages for terms such as superconductor, normal conductor, semiconductor, and the like. Similarly, the physical properties, characteristics, and parameters of metallic alloys used as electrically conductive materials as well as the methods for analyzing such parameters and characteristics are well understood and conventionally recognized in the art. For these reasons, specific details regarding the means and manner of making empirical determinations will generally be summarized only. For more detailed knowledge and information, a variety of printed publications are listed below, the individual texts of which are expressly incorporated by reference herein. These include: Howard H. Manko, *Solders And Soldering*, McGraw-Hill Book Company, 2nd edition, 1979; and M. A. Omar, *Elementary Solid State Physics: Principles And Applications*, Addison-Wesley Publishing Company, 1975.

In order to more easily and completely understand the chemical formulations, uses, essential physical parameters and characteristics, and advantages of the metallic alloys comprising the present invention, the detailed description will be presented as individual sections directed to specific attributes followed by the presentation of experiments and empirical data which factually evidence and support the detailed disclosure.

I. Chemical Composition And Formulations

The metallic alloys comprising the present invention are conductive mixtures of indium which can be formulated as binary, tertiary, quarternary, and even greater numerical systems of metals alloyed together For this reason, while the proportional amounts (generally determined as atomic percent) may vary greatly, it is most useful to characterize the individual formulations of alloys as being composed of a primary metal, indium, which has been alloyed with an additive composition comprising at least one other metallic substance. On this basis, at least three different groupings or subclasses of binary metallic alloys have been found useful. These are: alloys where the additive metal is mercury; alloys where the additive metal is gallium; and alloys where the additive metal is bismuth. Each binary alloy will be described individually.

Alloys Comprising Indium And Mercury

All of the preferred embodiments of the present invention employ mercury as part of the chemical formulation. In the most preferred embodiments, mercury alone is alloyed with indium, the ratio (in atomic percent) of mercury:indium being preferably either 13:87 or 33:67 respectively. These preferred binary mercury:indium alloys provide a eutectic mixture with a melting temperature of −31.5° C. or a solid mixture with a melting point of about 60° C. This is in contrast to the melting point of indium alone which is 156.6° C.—a temperaturte at which indium becomes a moderate reducing agent able to attack the ceramic surfaces. In general, when mercury is employed as an additive metal, it is most desirably employed alone with indium to form an amalgam. In this manner, mercury can be employed in this binary alloy system in an operative range ranging from about 10 to 40 atomic percent while indium is used as the primary metal in quantities ranging from about 90 to 60 atomic percent.

As an alternative, tertiary, quarternary, and other alloy systems can also be prepared utilizing both indium and mercury. In these instances, the other additive substances may include one or more of the following: gallium, bismuth, cadmium, tin, lead, and even very small amounts of copper and silver. The operative and preferred ranges in atomic percent of each additive metal are provided by Table I below.

TABLE I

| NAME | OPERATIVE RANGE (atomic percent) | PREFERRED RANGE (atomic percent) |
| --- | --- | --- |
| Primary Metal: | | |
| Indium | 10–90 | 13–17, 60–67, and 85–89 |
| Additive Composition: | | |
| Mercury | 10–40 | 11–15 or 33–40 |
| Gallium | 0–40 | 0–10 |
| Bismuth | 0–55 | 15–40 |
| Cadmium | 0–30 | 0–5 |
| Tin | 0–15 | 0 |
| Lead | 0–10 | 0 |
| Copper | 0–5 | 0–1 |
| Silver | 0–5 | 0–1 |

It will be appreciated that regardless of which metals are employed to formulate the additive composition to be alloyed with indium, an alloy is obtained which has a minimum melting point which in each instance is less than 100° C. Clearly, the precise melting point will vary with the choice of metals employed as the additive composition and their individual atomic percentages. It will be appreciated also that the recognized melting point for each of the metals comprising the additive composition has an individual melting point, each of which varies markedly from the other. This is demonstrated by Table II below. Nevertheless, the resulting alloy when prepared as described will in each instance demonstrate a melting point less than 100° C. and preferably provide a melting point in the range from about 50° to 60° C.

It will be noted and appreciated that this maximum melting temperature requirement is critical and essential for the alloys to be suitable with high temperature superconductors and other conductors. This is because the higher the melting temperature for the solder, the higher the likelihood of surface oxidation, reduction, and contamination which gives rise to increased electrical resistance of the junction. The avoidance of such surface oxidation, reduction, and contamination is one major difference and advantage provided by the unique metals alloys of the present invention.

TABLE II

| METAL | MELTING POINT (°C.)* |
| --- | --- |
| Indium | 156.61 |
| Mercury | −38.87 |
| Gallium | 29.78 |
| Bismuth | 271.3 |
| Cadmium | 320.9 |
| Tin | 231.89 |
| Lead | 327.5 |
| Copper | 1,083.0 |
| Silver | 960.8 |

*Handbook of Chemistry and Physics, The Chemical Rubber Company, 1970.

Alloys Comprising Indium And Gallium

The second grouping of metallic alloys within the present invention preferably employs gallium alone as the additive metal. In this instance, the preferred formulations employ a binary system of gallium and indium in a preferred atomic percent ratio of 10:90. This preferred binary alloy has a melting point of approximately 30° C.

In the alternative, gallium may be alloyed with indium and one or more other metals, with or without mercury. The operative and preferred ranges of the other metals believed useful in the additive composition are provided by Table III below.

TABLE III

| NAME | OPERATIVE RANGE (atomic percent) | PREFERRED RANGE (atomic percent) |
| --- | --- | --- |
| Primary Metal: | | |
| Indium | 0–90 | 70–90 |
| Additive Composition: | | |
| Gallium | 10–40 | 10–25 |
| Bismuth | 0–55 | 0–30 |
| Cadmium | 0–30 | 0 |
| Tin | 0–15 | 0 |
| Lead | 0–10 | 0 |
| Copper | 0–2 | 0–1 |
| Silver | 0–2 | 0–1 |

Alloys Comprising Indium And Bismuth

The third group of metallic alloys demonstrating the desired properties uses indium and bismuth as the binary alloy. There is a broad variety of different formulations and compositions comprising bismuth alone or in combination with other metals alloy solders It will be recognized and appreciated from the data provided by Table IV that each of the metals listed as a possible component of the additive composition has also been previously identified as useful in preparing alloys based on mercury and gallium as seen by Tables I and III respectively. The major differences, however, lie in the atomic percent of each individual metal in the operative and preferred ranges when bismuth is present in relatively high quantity.

TABLE IV

| NAME | OPERATIVE RANGE (atomic percent) | PREFERRED RANGE (atomic percent) |
| --- | --- | --- |
| Primary Metal: | | |
| Indium | 10–90 | 75–90 |
| Additive Composition: | | |
| Bismuth | 10–55 | 10–25 |
| Gallium | 0–40 | 10–20 |
| Cadmium | 0–30 | 0–10 |
| Tin | 0–15 | 0 |

TABLE IV-continued

| NAME | OPERATIVE RANGE (atomic percent) | PREFERRED RANGE (atomic percent) |
| --- | --- | --- |
| Lead | 0–10 | 0 |
| Copper | 0–2 | 0–1 |
| Silver | 0–2 | 0–1 |

A quick review of the data presented by Tables I to IV inclusive will, thus, reveal that the designations "additive" and "additive composition" are relative terms of convenience alone. Clearly, gallium which is listed as an optional component of the additive composition within Tables I and IV is the preferred additive metal of Table III. Similarly, the preferred additive metal of Table IV, bismuth, is listed merely as one metallic component optionally used to formulate the tertiary or quaternary alloys within the formulations of Tables I and III respectively. It is therefore apparent that the groupings of additives based dominately on mercury, gallium, or bismuth as previously described have been presented merely as an aide to understanding the range and variety of metallic components and formulations themselves; and do not represent major differences of kind among the individual alloy systems themselves. The representations of mercury, gallium, and bismuth as major additive substances are, thus, for convenience alone, and intended to identify at least one metal in the alloy formulation which is always present in measurable quantity in combination with indium— whereas the other metals may be optionally present or absent as required or desired by the individual user.

II. Essential Characteristics And Properties Of The Alloys Shared In Common

There are not less than four characteristics and physical properties shared in demonstratable degree by operative embodiments of the present invention. These physical parameters and features provide the capabilities and advantages common to all these alloyed solders; and serve as a factual basis by which any member of this class of alloys can be identified and differentiated from previously known and conventionally used solders. These are: unique wetting properties on superconductive ceramics; a melting point temperature less than 100° C. in all instances; chemically stable alloys which do not oxidize when melted and do not act as reducing agents to attack detrimentally other metals and/or ceramic oxides; a low electrical interface resistance for the alloys when applied which is not more than and preferably less than $10^{-3}$ ohms per square centimeter; and an easy and fast bonding process unlike the conventionally known methods.

Enhanced Wetting Properties

The role of wetting and the property of physical wetting by which a molten solder spreads over and adheres to a surface is conventionally understood and well described in the literature [see, for example, Howard H. Manko, Solders And Soldering, 1975, pages 4–21, and the references cited therein]. It is the physical wetting of the material to be electrically joined by the molten alloy that generates the spreading, adherent surface interface; and the solidification of the molten alloy after wetting which results in a permanent bond and juncture. A commonly accepted measurement of the wetting characteristics of any alloy is to measure the spreading surface angle, commonly called the dihedral angle (o), formed between the molten alloy and the surface of the solid material to be electrically joined. As recognized, the dihedral angle (o) is a measure of the surface tension, gravity, and interfacial tensions between the molten alloy and its surroundings as positioned on the surface of the material to be joined. Totally nonwetting compositions demonstrate an angle (o) of about 180 degrees; totally wetting alloys reveal an angle (o) of about 0 degrees; and substances having an angle (o) between 180 and 0 degrees are deemed partially wetting composition. In sum, the less the dihedral angle (o), the greater the wetting properties of the composition.

All of the metallic alloys comprising the present invention provide greatly improved wetting properties with a demonstratable dihedral angle ranging generally from about 65 to 105 degrees. The preferred mercury:indium alloys show extremely good wetting characteristics with a dihedral angle smaller than 75 degrees, and often less than 65 degrees. It will be recognized that the degree of wetting and the measurement of the dihedral angle varies dramatically with the purity and cleanliness of the surfaces of the material to be joined and the metallic alloy itself. It is most desirable that the materials be free of oils, moisture, foreign oxidized particles, and the like—each of which markedly contributes to reducing the degree of wetting. The best results are achieved with freshly cleaned and polished surfaces on the materials to be electrically joined. Merely illustrative of the metallic alloys which provide enhanced wetting properties are those listed within Table V below.

TABLE V

| ALLOY | RATIO (atomic percent) | DIHEDRAL ANGLE (estimated) |
| --- | --- | --- |
| Hg:In | 13:87 | o ≦ 75° |
| Hg:In | 37:63 | o ≦ 75° |
| In:Ga | 92:8 | o ≦ 75° |
| Bi:In | 22:78 | o ≦ 75° |
| Hg:In:Ga | 5:85:10 | o ≦ 75° |
| Bi:In | 35:65 | o ≦ 75° |
| Sn:In:Hg | 5:80:15 | o ≦ 75° |
| In:Ga | 24:76 | o ≦ 75° |
| Cd:Ga:In | 5:15:80 | o ≦ 75° |
| Pb:In:Hg | 5:80:15 | o ≦ 75° |
| Cd:In:Hg | 4:80:16 | o ≦ 75° |
| Hg:Ga:Cd:In | 10:5:10:75 | o ≦ 75° |

Melting Point Temperatures Less Than 100° C.

Some of the preferred metallic alloys and amalgams formulated in accordance with the present invention are eutectic mixtures; and some are solid state metallic mixtures. The melting point for all those alloys is in each instance less than 100° C. The preferred embodiments composed of mercury and indium alone, particularly those formulations containing more than 65 atomic percent indium, provide an amalgam which melts at a temperature about 60° C. The other alloys formulated, with or without mercury, generally have a melting point ranging from about −40° to 95° C. None of these metallic alloys will demonstrate a melting point above 100° C.

There are both physical and chemical benefits provided by this reduced melting point property common to all the properly prepared metallic alloys. First, these alloys minimize mechanical and chemical stresses as well as potential alterations to the chemical composition of the superconductive ceramics and conductive metals. Exposure to temperatures less than 100° C. offers a reduced exposure to heat. Equally important, it is now well recognized that one of the crucial parameters in maintaining the superconductivity properties of ceramic oxides is to limit or control the amount of oxygen in the compound. By providing melting points for the alloys and a bonding temperature which is not greater than 100° C., the bonding temperature is sufficiently low as to avoid oxidizing or reducing substantially the surfaces of the ceramic oxides and conductive metals; this bonding temperature is also low enough as to avoid other chemical alterations to the superconductive or conductive materials themselves.

In addition, a quick solidification of the molten solder is provided by some of the present metallic alloys. A quick solidification is just the time needed to obtain an adherent, effective mechanical and electrical contact between the materials being joined.

Enhanced Chemical Stability

Another major property and characteristic of the present metallic alloys and amalgams is their ability to avoid being oxidized substantially even when liquified. This is due to their unique property of melting at temperatures less than 100° C.; and is also due to the chemical stability of the formulations themselves which resist oxidation during the heating process into semi-liquid or completely liquified states. Equally important, the chemical compositions of the metallic alloys themselves, regardless of atomic percentage, are chemically stable and do not in any meaningful degree attack or react with the superconductive ceramic oxides or conductive metals to be joined. Accordingly, an electrical contact and juncture is provided by these alloys between superconductive materials and other metals and ceramics which is mechanically strong and chemically resistant over an indefinite time period.

A Minimum Electrical Interface Resistance

As will be empirically demonstrated hereinafter, the electrical properties of the metallic alloys and amalgams of the present invention, each alloy after proper application and use will demonstrate an electrical interface resistance at room temperature which is not more than about $10^{-3}$ ohms per square centimeter. Some preferred embodiments provide an electrical interface resistance at room temperature as low as $10^{-5}$ ohms per square centimeter. In all instances, at room temperature (about 300° K. or 20° C.) and at liquid nitrogen temperatures (about 77° K. or −195° C.) the electrical contacts provided by these metallic alloys are basically ohmic. The electrical contact resistance depends upon the initial surface preparation and the formulation of the metallic alloy employed. For example, in the preferred embodiments utilizing only mercury and indium, the eutectic mixture (33:67) of mercury:indium is liquid at room temperature. The initial contact resistance of about $10^{-3}$ ohms/square centimer first decreases approximately 18% per hour with a time constant of about one hour; and then increases approximately 1.3% per hour with a time constant of about 8 hours. Alternatively, the (13:87) mixture of mercury:indium which is a solid at room temperature and demonstates a melting point of 60° C., has an electrical interface resistance which only decreases at about 2.7% per hour with approximately the same long time constant of 8 hours. Clearly, the precise electrical interface resistance will thus vary with the chemical composition and precise formulation of the metallic alloy employed. To further illustrate the range and variety of electrical interface resistance, the data of Table VI is provided.

TABLE VI

| ALLOY | RATIO (atomic percent) | ELECTRICAL INTERFACE RESISTANCE AT (/cm$^2$) | |
|---|---|---|---|
| | | 77° K. | 300° K. |
| Hg:In | 13:87 | $10^{-4}$ | $10^{-4}$ |
| Hg:In | 37:63 | $10^{-5}$ | $10^{-5}$ |
| Ga:In | 8:92 | $10^{-3}$ | $10^{-3}$ |
| Hg:In:Ga | 5:85:10 | $10^{-3}$ | $10^{-3}$ |
| Bi:In | 22:78 | $10^{-3}$ | $10^{-3}$ |

III. Preparation Of The Metallic Alloys

The preparation of metallic alloys comprising the present invention follows conventional practice regarding the blending of metals. As recognized, each metal has its individual and distinctive melting point as indicated by Table II previously. Once the desired formulation and chemical composition of the alloy to be prepared has been decided, the proper atomic percentage amount of each metal is to be placed into a crucible which is then heated at a temperature slightly greater than the melting point of the metal with the highest melting temperature. Each metal is added to the crucible in turn and the resulting liquid is preferably stirred mechanically to help the alloying process. When the liquified alloy has been formed, the liquid alloy mixture is allowed to stand motionless in order to allow such oxides or other impurities as might have been formed to float to the top and to be skimmed off. It is most desirable that the temperature of the crucible be maintained as closely as possible to reduce the risk of oxides being created. Moreover, when any of the metals used in the formulation is recognized as being substantially reactive with molecular oxygen, it is required that the alloying method be performed within a closed, non-oxidizing atmosphere (such as a nitrogen environment) to avoid adulterations to the mixing and alloying process.

Once prepared as a molten alloy, the liquid mixture can then be prepared in any desired shape, size, or format using the normal procedures and apparatus of casting, molding, etc. It is most desirable, however, that sensible precautions be used to avoid accidentally oxidizing or tampering with the alloy during this shaping process.

IV. Method Of Using The Metallic Alloys

The uses of the unique metallic alloys are for making electrical and mechanical contact between superconductive materials themselves, to normal conductive materials, and to semi-conductive materials and metals as well. An illustrative example would be the attachment of normally conductive metallic electrodes to a superconducting ceramic oxide in order to complete a desired electrical circuit. For illustrative purposes only, therefore, the description of the method of use will be limited in detailed description to this specific context; nevertheless, it will be understood and accepted that this description is merely representative of the general methodology which is deemed applicable to any combination of electrically conductive materials of any kind or composition.

To ensure wettability and a minimum of electrical resistance as a result of using these unique metallic alloys, it is imperative that the surfaces of the ceramic oxide and the metal electrode be free of oil, moisture, alloy oxides, and any other impurity. The preferred relative humidity surrounding the bond while soldering is preferably from 0 to 75 percent, the wettability of the alloy being enhanced in ever drier environments.

In general, a soldering iron commonly used in printed circuit soldering, is suitable for melting the alloy when present in a solid physical state and for physically spreading the heated alloy onto the ceramic oxide material. The recommended temperature of the soldering iron (or other similar heating apparatus) is approximately 60° C., a temperature which can be effectively controlled by connecting the soldering iron to a "Variac" autotransformer. It will be understood, however, that the exact heating temperature presented by the soldering iron (or other heating apparatus) will conform to that minimal temperature necessary to render the solid alloy into a semi-liquid, mushy state or into a completely liquified form. Under no circumstances whatsoever, is this heating temperature to exceed approximately 100° C.

As a first step, the surface of the ceramic oxide (or other material) where the bond is to be made should be freshly prepared, cleansed, and preferably polished by using fine emery cloth. If the surface of the ceramic is not sufficiently polished, the physical act of bonding by the alloy can still be made; however, the degree of mechanical strength and the electrical interface resistance will consequently be altered It is also most desirable that the surface of the metal (or other matter) to be joined to the ceramic oxide material also be dry and free of oils and other impurities such as soldering flux paste, fingerprints, dust, and the like.

The prepared alloy or amalgam is then heated using the soldering iron at the controlled minimal temperature; and the alloy brought to a semi-liquid (mushy) or completely liquid state. The heated alloy is then rubbed physically onto the freshly prepared, polished surface of the ceramic oxide material until the surface is completely wetted by the heated alloy. It is desirable that the temperature of the ceramic oxide material be identical to the temperature of the heated alloy at the moment of physical contact to aid the wetting process. Similarly, the cleansed, non-oxidized surface of the metal electrode to be joined to the ceramic oxide should also be wetted with the heated alloy in a similar fashion. This physical introduction of heated alloy and wetting of the surfaces of the materials to be electrically joined is a necessary preliminary step in order to ensure an effective mechanical bonding contact which is resistant to mechanical and chemical stresses. The heated alloy is applied directly onto the ceramic surface preferably using a soldering iron at the desired heating temperature and concurrently applied to the surface of the metal as well. Subsequently, the alloy-wetted surfaces of the ceramic oxide and the metal electrode are joined together with additional heated alloy to form a juncture or physical union using the additional heated alloy as a bridge material. After the alloy juncture is physically formed, it is allowed to cool and solidify. The solidified alloy juncture then demonstrates not only a mechanical bond resistant to physical and chemical stresses, but also an electrical interface resistance which is in the order of $10^{-3}$ ohms per square centimeter.

Several precautions regarding the manner of using the metallic alloys and its application to the surfaces of superconductive ceramic oxides and normally conductive metal electrodes should be noted. Initially, it will be recognized that metallic alloys comprising the present invention may be presented initially at room temperature (20° C.) in either solid or liquid physical states. For the solid state formulations of the alloys, the recommended temperature for the soldering iron (or other heating apparatus) is not more than the highest temperature required to begin the melting process, and preferably is only 60° C. At temperatures markedly higher than that necessary to melt the metallic alloy, the wettability of the alloy will decrease and a very real risk of moderate oxidation, reduction, or surface contamination can occur. Similarly, at temperatures lower than the minimal melting point temperature for the alloy, the alloy becomes solid which, in turn, impairs the ability to wet the surfaces of the ceramic oxide and metal electrodes. Alternatively, for those alloy formulations which are liquid at room temperature, the operative use temperature limits extend from approximately 20° C. to the actual solidification temperature for the bonding alloy.

As regards the timing for the soldering process, the minimal time limit required to make an effective bond using a semi-liquid or liquified alloy is approximately 3 seconds per square millimeter of surface area when using a pencil type soldering iron. There is no maximal time limit for the actual soldering, but it is desirable that no more than 10 seconds per square millimeter of contact surface be utilized to avoid creating oxidation conditions or alterations to the materials themselves. When soldering metallic surfaces, it is not recommended to extend the soldering time unnecessarily to avoid the formation of intermetallic compositions which will alter the melting point, wetting properties, or other characteristics of the bonding alloy. Again, in preferred use environments, the relative humidity surrounding the act of bonding the alloy to the conductive materials should be as low as possible, and be less than 75 percent humidity in all instances.

V. Nature Of Materials To Be Electrically Joined By The Metallic Alloys

The metallic bonding alloys comprising the present invention are most useful for bonding superconductive materials to themselves, to normal electrical conductors, or to semi-conductive materials. The characteristics and advantages which make this class of bonding alloys unique and different from those previously known and used in this field are the following:

1. The bonding alloys create an intimate direct contact between the materials joined together, be they superconductors such as ceramic oxides, or normal conductors such as ordinary metals, or semi-conductors;

2. The bonding alloys minimize mechanical and chemical stresses and avoid alterations to superconductors such as ceramic oxides. Since one of the crucial parameters of high $T_c$ superconductive materials is the amount of oxygen present in the compound, the bonding temperatures of the present alloys and methods are sufficiently low as to avoid risk of substantial reduction or chemically altering the superconductive material themselves;

3. The bonding alloys are substantially easier and more convenient to use than currently used solders; and 4. The alloys and the methods employing them substantially reduce the time required to obtain a reliable contact of cast strength and minimal electrical interface resistance.

The range of materials which can be electrically joined includes superconductors, normal conductors, and semi-conductors. As regards superconductive materials, a wide range of substances including refractory oxide compositions, metallic alloys, and atomic elements have recognized properties which identify them as superconductive compositions. A representative, but incomplete, listing is provided by Table VII below.

TABLE VII

| SUPERCONDUCTIVE COMPOSITION | $T_c$ (Range, °K.) | PUBLISHED REFERENCE |
|---|---|---|
| Refractory Oxide Ceramics: | | |
| yttrium barium copper oxides ($YBa_2Cu_3O_{7-x}$) | up to 93 | |
| BiSrCaCuO | | |
| TlBaCaCuO | up to 110 | t |
| Alloys: | | |
| $Nb_3Al_{0.8}Ge_{0.2}$ | 20.1 | * |
| $Nb_3Sn$ | 18.1 | * |
| $Nb_3Al$ | 17.5 | * |
| $Nb_3Au$ | 11.5 | * |
| $Nb_3N$ | 16.0 | * |
| MoN | 12.0 | * |
| $V_3Ga$ | 16.5 | * |
| Elements: | | |
| Al | 1.2 | * |
| Cd | 0.5 | * |
| Ga | 1.1 | * |
| In | 0.1 | * |
| La ($\alpha$) | 4.8 | * |
| La ($\beta$) | 4.9 | * |
| Pb | 7.2 | * |
| Hg ($\alpha$) | 4.2 | * |
| Hg ($\beta$) | 4.0 | * |
| Mo | 0.9 | * |
| Nb | 9.3 | * |
| Os | 0.7 | * |
| Rh | 1.7 | * |
| Ru | 0.5 | * |
| Ta | 4.5 | * |
| Tc | 8.2 | * |
| Tl | 2.4 | * |
| Th | 1.4 | * |
| Sn | 3.7 | * |
| Ti | 0.4 | * |
| W | 0.01 | * |
| U ($\alpha$) | 0.6 | * |
| U ($\beta$) | 1.8 | * |
| V | 5.3 | * |
| Zn | 0.9 | * |
| Zr | 0.8 | * |

*M.A. Omar, Elementary Solid State Physics: Principles And Applications, 1975, p 499.
Wu et al., Phys. Rev. Lett. 58:905 (1987).
t Chu et al. Phys. Rev. Lett. 60:941 (1988); amd Dai et al., Intern. J. Mod. Phys. B3:77 (1989).

It will be recognized and appreciated, however, that certain kinds of refractory ceramic oxides which have only recently been developed and which are representative of "high $T_c$ superconductors" are most suitable for use with the bonding alloys of the present invention. The utilization and deployment of high $T_c$ superconductive materials in large current applications will depend in large part on the electrical interface resistance of the high $T_c$ materials with each other, with other superconductors, and with normal metals. The bonding alloys comprising the present invention have been demonstrated to be basically ohmic in accordance with the general formula for mathematically calculating ohmic behavior (V=R.I). Consequently, the contact electrical resistance will depend upon the formulation and chemical composition of the alloy, the purity of the prepared surfaces, and on the time after actual bonding with the alloy.

In the alternative, the superconductive materials can be electrically bonded using the metallic alloys of the present invention to normally conductive metals, a partial listing of which includes copper, silver, gold, nickel, iron, tin, lead, zinc, and their respective alloys. These metals are conventionally recognized and commonly used alone or in alloyed form for making electrical contacts and circuits within the normal temperature variation and limits of the natural environment Moreover, the unique bonding alloys of the present invention may be employed to electrically join superconductive materials to semi-conductors as well. Such generally recognized and commonly available semiconductors include carbon, silicon, germanium; and metallic salts of arsenic, phosphates, antimony, sulfur, selenium, technesium, and the like. However, without question, the most preferred application for the unique bonding alloys is for electrically joining refractory ceramic oxides of the "perovskite" structure and oxide superconducting ceramics in general [*Novel Superconductivity* (S. A. Wold and V. Z. Kresin, editors) Plenum Press, 1987, p. 599].

VII. Experiments And Empirical Data

A series of experiments and data are described hereinafter which provide direct evidence and factual support for the properties, characteristics, and advantages of the bonding alloys comprising the present invention. The experimental series which follows uses variations of a single test apparatus to measure electrical resistance and other parameters of the bonding alloys. Electrical resistance empirically determined is the sum of the bonding alloy ceramic oxide contact resistance plus the resistance of the ceramic oxide between the bonding alloy contacts.

The data presented here were obtained using two preferred compositions of the metallic alloys: the eutectic composition of 33% mercury and 67% indium, which melts at −31.5° C. and is therefore liquid at room temperature; and the 13% mercury and 87% indium which melts at about 60° C. and is thus solid at room temperature. In the description which follows, they will be referred to as the eutectic and solid mixtures respectively. The electrical resistance and other parameters of both the eutectic and solid mixtures were measured by using the four probe standard apparatus and technique conventionally known in the following manner.

A cylindrical superconducting ceramic oxide of $YBa_2Cu_3O_{7-x}$ was prepared as a pellet ½ inch in diameter and approximately 3 millimeters high. Two copper cables were soldered at the same point at the center of each of the two flat surfaces of the superconducting pellet making a total of four cables. The method for using the bonding alloy for soldering and making electrical contacts was the one previously described in which a soldering iron was maintained at 60° C. for melting solid alloys; and in which the soldering iron was kept at room temperature (approximately 20° C.) for introducing bonding alloys which are liquid at room temperature. The extension of the solder contacts on each face of the pellet was approximately 4 square millimeters each. This was arrangement A of the apparatus.

In use, a known electrical current was applied across the superconductive pellet of arrangement A using two of the attached cables, one from each face. The two remaining cables were connected to a voltmeter in order to measure the voltage drop created across the pellet plus the contacts, due to their electrical resistance. The observed and recorded voltage drop was then mathematically plotted against the known current as they fluctuated The relationship between the voltage and the current was found to be a substantially straight line which indicated effective ohmic behavior wherein V=R.I.

An alternative arrangement of the apparatus was to have four solder joints or pads, all in a row. This constituted arrangement B. The current is passed through the two outer pads and the voltage $V_1$ is measured across the inner pads. The inner pads also have two cables attached to each of them, and the voltage $V_2$ can be measured across the inner pad cables while applying the same current only to the inner pads. By subtraction of the voltages, one can obtain the pure contact resistance.

FIG. 1 shows the current-voltage characteristics of the eutectic alloy taken so that both the resistance of the sample and the contacts are measured. The measurement was done at a temperature of 77° K. at low currents. The fact that the line is straight at low currents shows that in this regime the sample obeys Ohm's Law. The slope of the line divided by the area through which the current passes is defined as the resistance. In this case, the resistance is $4.17 \times 10^{-4}$ ohm per square centimeter.

Figure 2:
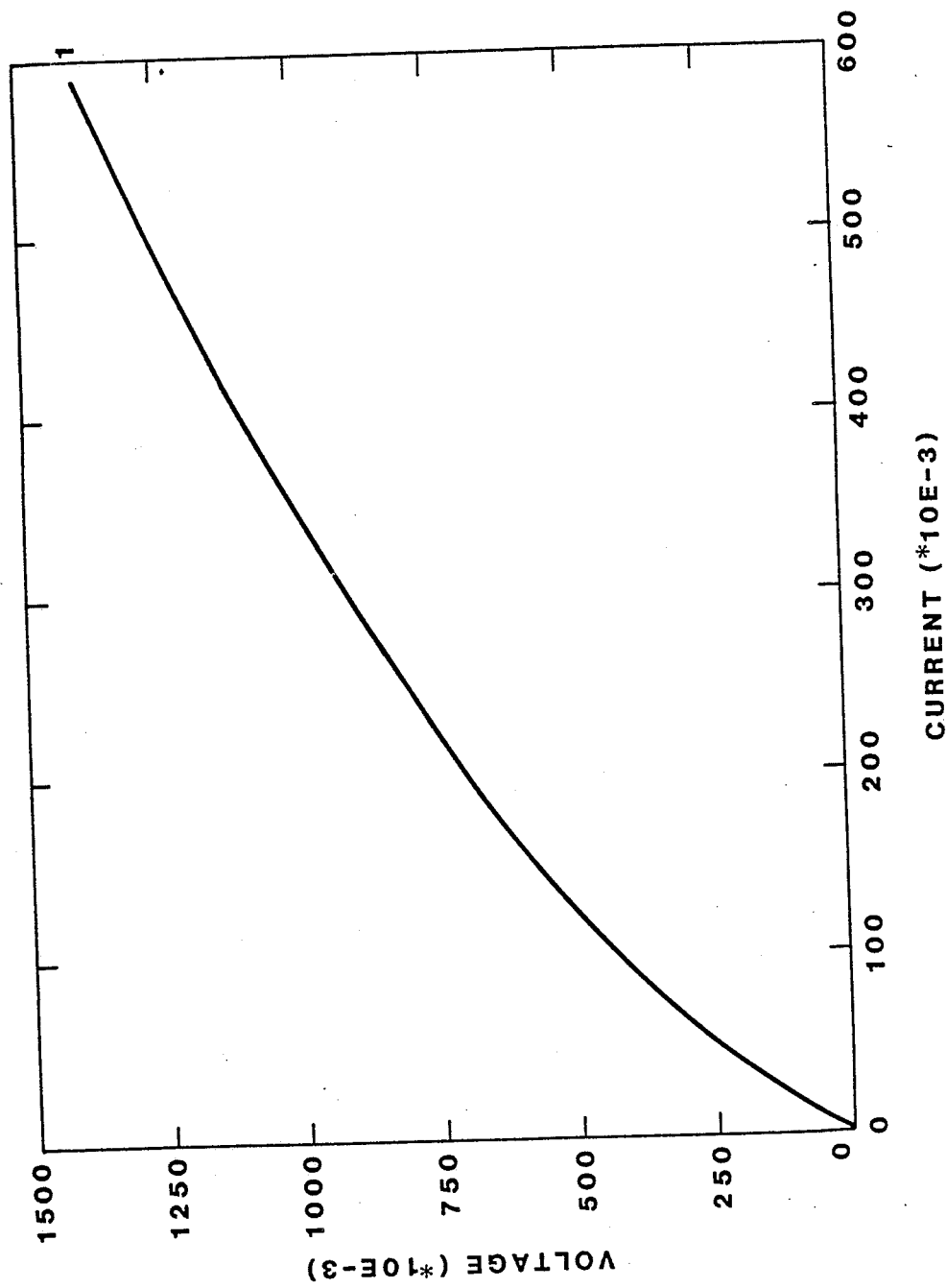
FIG. 2 is a graph of the eutectic mixture embodiment evaluated within FIG. 1 at higher current after 30 hours duration.

FIG. 2 provides the same measurements as of the eutectic mixture as indicated by FIG. 1 but at a higher current and after the contacts have been on for 30 hours. The bending of the curve indicates that the contact exhibits some semiconducting properties and that the resistance decreases with current. This is especially evident in FIG. 3 where the slope of the line decreases at high currents up to 0.6 amperes. In this case, the resistivity at 0.5 amperes for the eutectic alloy is measured to be $1.37 \times 10^{-4}$ ohms per square centimeter.

Figure 3:
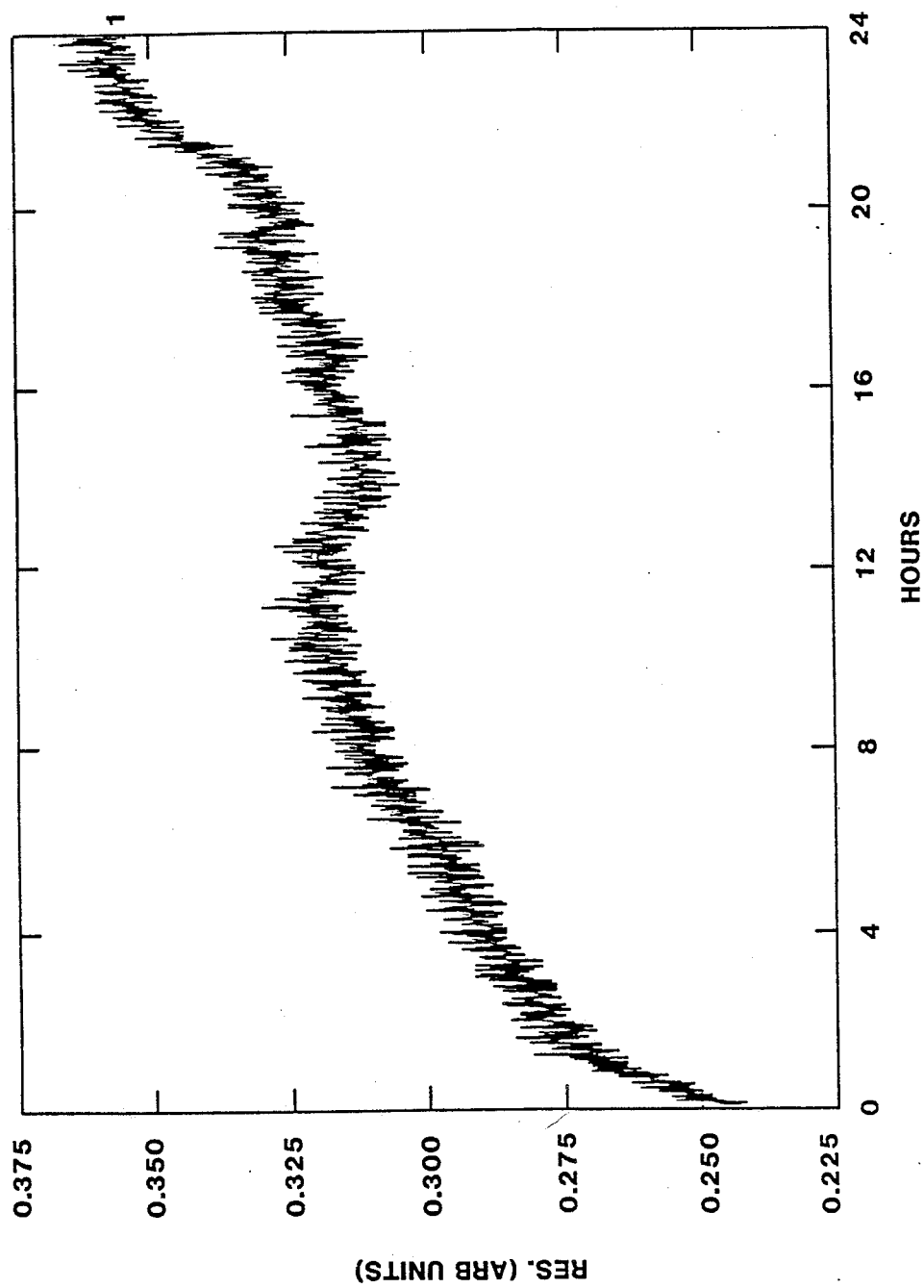
FIG. 3 is a graph illustrating the time dependence of the resistance measured at room temperature for the eutectic mixture embodiment of FIG. 1 beginning 5 hours after bonding.
Figure 4:
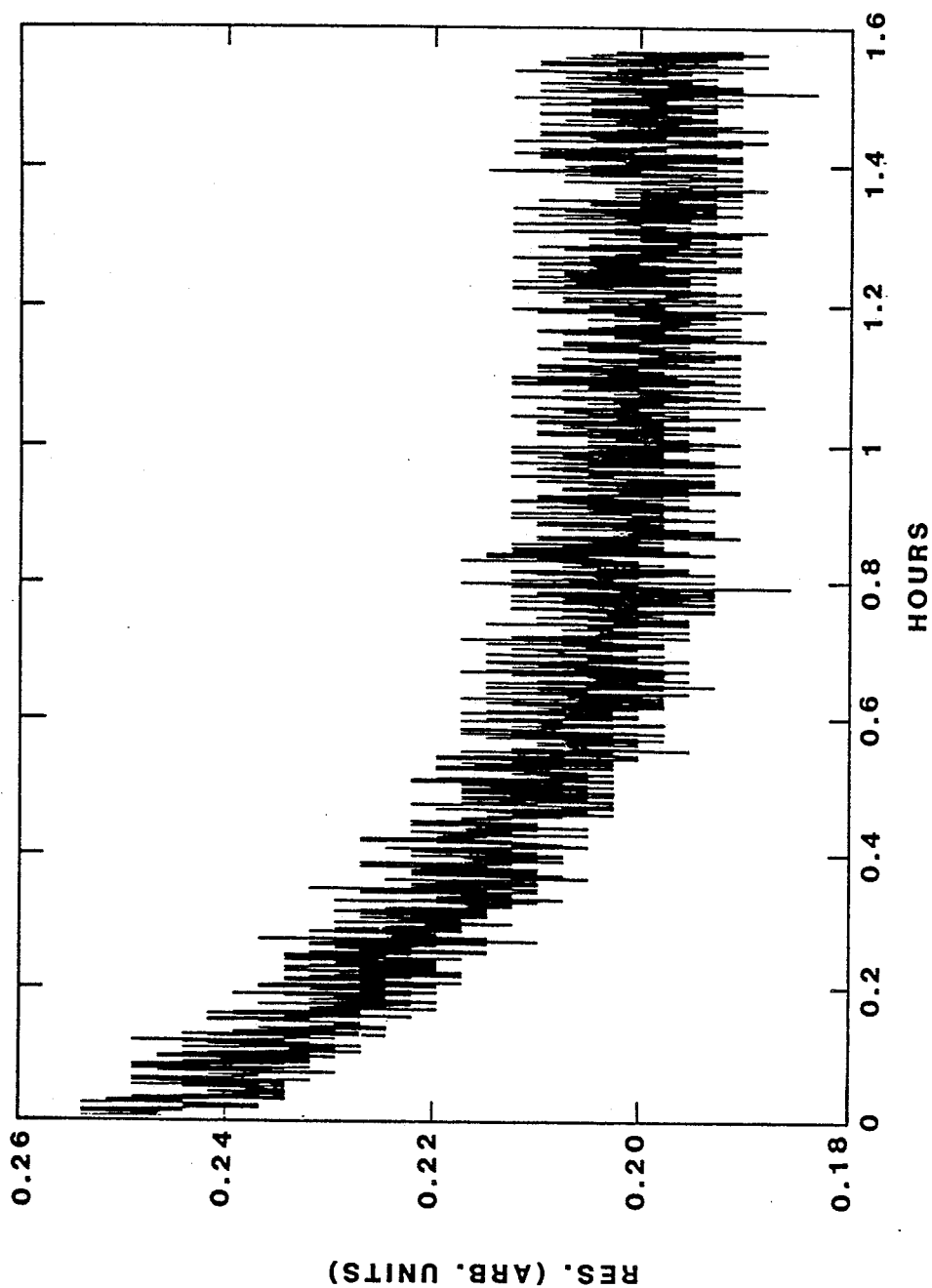
FIG. 4 is a graph illustrating the decrease in electrical resistivity of the eutectic mixture embodiment of FIG. 3 at time intervals up to 1.6 hours after bonding.

In order to measure the time dependence of the resistivity for the eutectic mixture, the resistance was measured as a function of time. FIGS. 3 and 4 show the time dependence of the resistance measured at room temperature. One sees that the resistivity decreases for this eutectic mixture for times up to 1.6 hours after the joint is made in FIG. 4 while in FIG. 3 it increases up to 24 hours and then remains steady. No change or much smaller changes with time would be expected if the sample were held at a temperature of 77° K.

Figure 5:
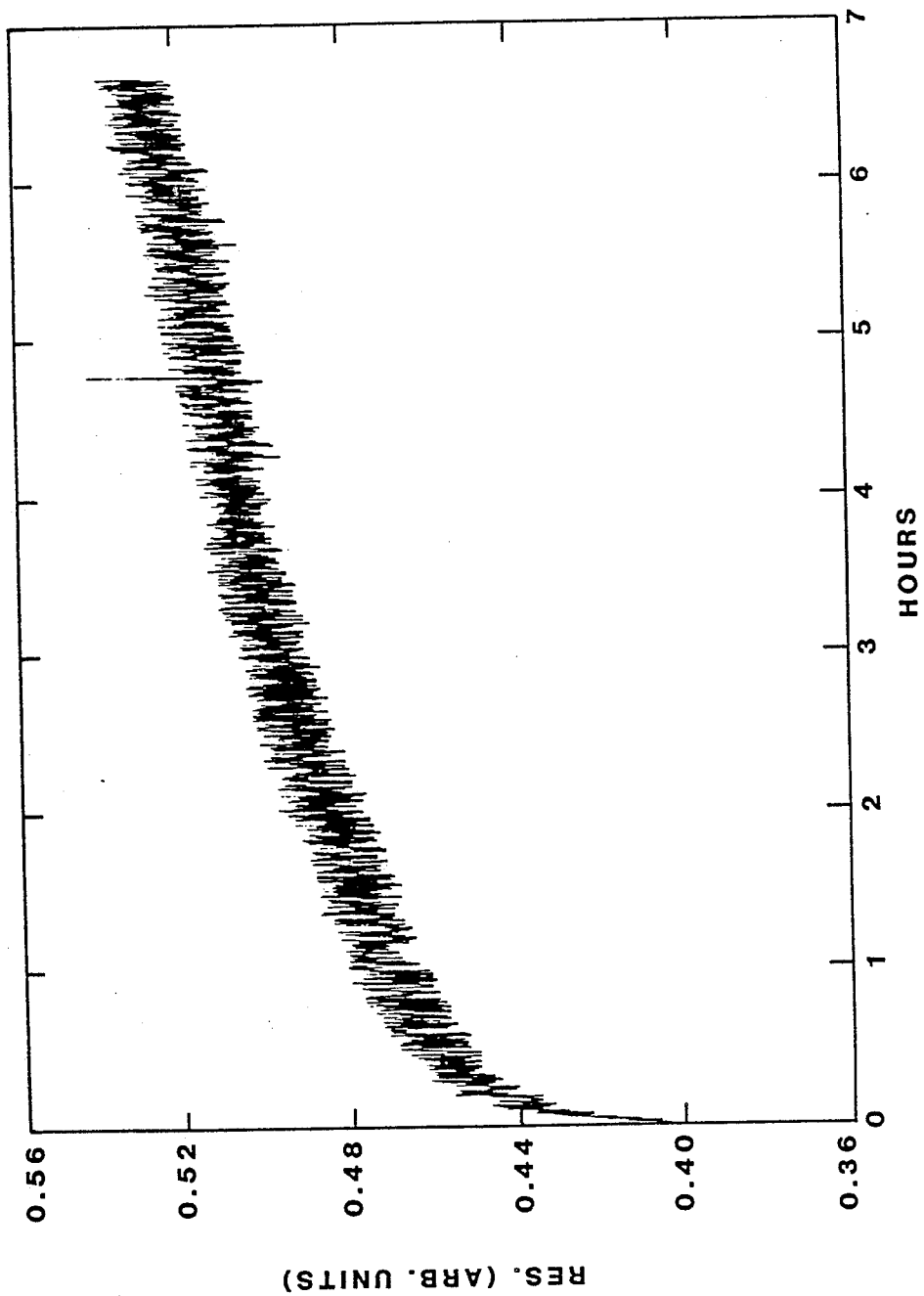
FIG. 5 is a graph illustrating the electrical resistivity over time for a preferred solid mixture embodiment of the present invention.

The time dependence of the solid mixture at room temperature is shown by FIG. 5. The solid mixture does not show an initial decrease in the resistivity as the eutectic mixture does. The resistivity only increases and then becomes constant after 24 hours.

The present invention is not to be restricted in form nor limited in scope except by the claims appended hereto.

I claim:

1. A method for electrically joining superconductive materials to themselves, to conductive materials, or to semi-conductive materials, said method comprising the steps of:
    obtaining a bonding alloy comprising from about 50 to 90 atomic percent indium, and an additive comprised of from about 0 to about 40 atomic percent mercury, from 0 to about 40 atomic percent gallium, and from 0 to about 55 atomic percent bismuth;
    preparing a surface of each material to be joined as a clean surface;
    heating said alloy such that at least a non-oxidized, semi-liquid state is formed;
    introducing said heated alloy to each non-oxidized surface such that each of said surfaces becomes substantially wetted by said heated alloy;
    applying additional heated alloy to each of said wetted surfaces concurrently to form a continuous alloy juncture between said materials; and
    allowing said alloy juncture to solidify such that a joined electrical interface resistance of not more than $10^{-3}$ ohms per square centimeter is provided by said solidified alloy at temperatures not greater than about 20° C.

2. A method for electrically joining superconductive materials to themselves, to conductive materials, or to semi-conductive materials, said method comprising the steps of:
    obtaining a bonding alloy comprising from about 50 to 90 atomic percent indium, and an additive comprised of from about 0 to about 40 atomic percent mercury, from 0 to about 40 atomic percent gallium, from 0 to about 55 atomic percent bismuth, from 0 to about 30 atomic percent cadmium, from 0 to about 15 atomic percent tin, and from 0 to about 10 atomic percent lead;
    preparing a surface of each material to be joined as a clean surface;
    heating said alloy such that at least a non-oxidized, semi-liquid state is formed;
    introducing said alloy amalgam to each non-oxidized surface such that each of said surfaces becomes substantially wetted by said heated alloy;
    applying additional heated alloy to each of said wetted surfaces concurrently to form a continuous alloy juncture between said materials; and
    allowing said alloy juncture to solidify such that a joined electrical interface resistance of not more than $10^{-3}$ ohms per square centimeter is provided by said solidified alloy at temperatures not greater than about 20° C.

3. The method as recited in claim 1 wherein said bonding alloy is comprised essentially of only indium and mercury.

4. The method as recited in claim 1 wherein said bonding alloy is comprised essentially of only indium and gallium.

5. The method as recited in claim 1 wherein said bonding alloy is comprised essentially of only indium and bismuth.

6. The method as recited in claim 1 wherein said bonding alloy is comprised of indium and an additive comprising at least two other metals.

* * * * *